United States Patent
Hsu et al.

(10) Patent No.: US 11,381,247 B1
(45) Date of Patent: Jul. 5, 2022

(54) METHOD OF DETECTING JITTER IN CLOCK OF APPARATUS AND APPARATUS UTILIZING SAME

(71) Applicant: UNITED MICROELECTRONICS CORP., Hsin-Chu (TW)

(72) Inventors: Wen-Hong Hsu, Hsinchu (TW); Po-Hua Chen, Changhua County (TW); Yu-Yee Liow, Hsinchu County (TW); Chih-Wei Wu, Kaohsiung (TW); Hsuan-Chih Yeh, New Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/225,074

(22) Filed: Apr. 7, 2021

(51) Int. Cl.
  *H03D 3/24* (2006.01)
  *H03L 7/089* (2006.01)
  *H03L 7/10* (2006.01)
  *H03L 7/083* (2006.01)
  *H03L 7/095* (2006.01)

(52) U.S. Cl.
  CPC ............ *H03L 7/0891* (2013.01); *H03L 7/083* (2013.01); *H03L 7/095* (2013.01); *H03L 7/102* (2013.01)

(58) Field of Classification Search
  CPC ....... H03L 7/0891; H03L 7/102; H03L 7/083; H03L 7/095; G01R 31/31709

USPC .................................................. 375/371–376
See application file for complete search history.

(56) References Cited

U.S. PATENT DOCUMENTS

| | | | |
|---|---|---|---|
| 7,447,491 B2 * | 11/2008 | Khoini-Poorfard | H04H 40/90 455/553.1 |
| 7,511,543 B2 | 3/2009 | Friedman | |
| 8,076,979 B2 | 12/2011 | Kathuria | |
| 2008/0172193 A1 * | 7/2008 | Rhee ................ | G01R 31/31709 702/69 |

FOREIGN PATENT DOCUMENTS

CN          1332508 C       8/2007

* cited by examiner

*Primary Examiner* — Phuong Phu
(74) *Attorney, Agent, or Firm* — Winston Hsu

(57) ABSTRACT

An apparatus includes a phase-locked loop and a jitter detection circuit. A method of detecting a jitter in the apparatus includes the phase-locked loop generating a lead control signal and a lag control signal according to a reference clock and a feedback clock, the jitter detection circuit generating a jitter signal according to the lead control signal and the lag control signal, the jitter detection circuit generating a jitter window signal according to the jitter signal, the jitter detection circuit identifying jitters in the clock signal according to the jitter signal and the jitter window signal, and the jitter detection circuit outputting a jitter indication signal according to the number of jitters identified.

18 Claims, 7 Drawing Sheets

US 11,381,247 B1

METHOD OF DETECTING JITTER IN CLOCK OF APPARATUS AND APPARATUS UTILIZING SAME

BACKGROUND OF THE INVENTION

1. Field of the Invention

The invention relates to signal stability, and in particular, to a method of detecting jitter in a clock of an apparatus and an apparatus utilizing the same.

2. Description of the Prior Art

Phase locked loops are used to synthesize new clock frequencies that are a multiple of a reference clock frequency. The new clock frequencies can be utilized in electronic apparatuses to process signals. Jitter is the timing variation of an actual clock edge from an ideal clock edge and can be affected by factors such as thermal noise, device noise, interference from other circuits, supply voltages and loading conditions. As clock speeds increase, jitter in the clock can degrade system performance significantly and needs to be detected and taken care of.

Accordingly, an apparatus capable of detecting jitter in clock in an accurate and reliable manner is in need.

SUMMARY OF THE INVENTION

According to an embodiment of the invention, a method of detecting a jitter in an apparatus is provided. The apparatus includes a phase-locked loop, and a jitter detection circuit, the phase-locked loop including a phase detector, a charge pump, a filter, a voltage controlled oscillator, a feedback unit and an output unit. The method includes the phase detector generating a lead control signal and a lag control signal according to a reference clock and a feedback clock, the charge pump generating an intermediate voltage according to the lead control signal and the lag control signal, the filter filtering the intermediate voltage to generate a filtered voltage, the voltage controlled oscillator generating an oscillation signal according to the filtered voltage, the feedback unit generating the feedback clock according to the oscillation signal, the output unit outputting a clock signal according to the oscillation signal, the jitter detection circuit generating a jitter signal according to the lead control signal and the lag control signal, the jitter detection circuit generating a jitter window signal according to the jitter signal, the jitter detection circuit identifying jitters in the clock signal according to the jitter signal and the jitter window signal, and the jitter detection circuit outputting a jitter indication signal according to the number of jitters identified.

According to another embodiment of the invention, an apparatus of detecting a jitter includes a phase-locked loop and a jitter detection circuit. The phase-locked loop includes a phase detector, a charge pump, a filter, a voltage controlled oscillator, a feedback unit and an output unit. The phase detector is used to generate a lead control signal and a lag control signal according to a reference clock and a feedback clock. The charge pump is coupled to the phase detector, and is used to generate an intermediate voltage according to the lead control signal and the lag control signal. The filter is coupled to the charge pump, and is used to filter the intermediate voltage to generate a filtered voltage. The voltage-controlled oscillator is coupled to the filter, and is used to generate an oscillation signal according to the filtered voltage. The feedback unit is coupled to the voltage-controlled oscillator and the phase detector, and is used to generate the feedback clock according to the oscillation signal. The output unit is coupled to the voltage-controlled oscillator, and is used to output a clock signal according to the oscillation signal. The jitter detection circuit is coupled to the phase detector, and includes a jitter extraction circuit, a jitter window circuit, a jitter identification circuit and a jitter indication circuit. The jitter extraction circuit is used to generate a jitter signal according to the lead control signal and the lag control signal. The jitter window circuit is coupled to the jitter extraction circuit, and is used to generate a jitter window signal according to the jitter signal. The jitter identification circuit is coupled to the jitter extraction circuit and the jitter window circuit, and is used to identify jitters in the clock signal according to the jitter signal and the jitter window signal. The jitter indication circuit is coupled to the jitter identification circuit and is used to output a jitter indication signal according to the number of jitters.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
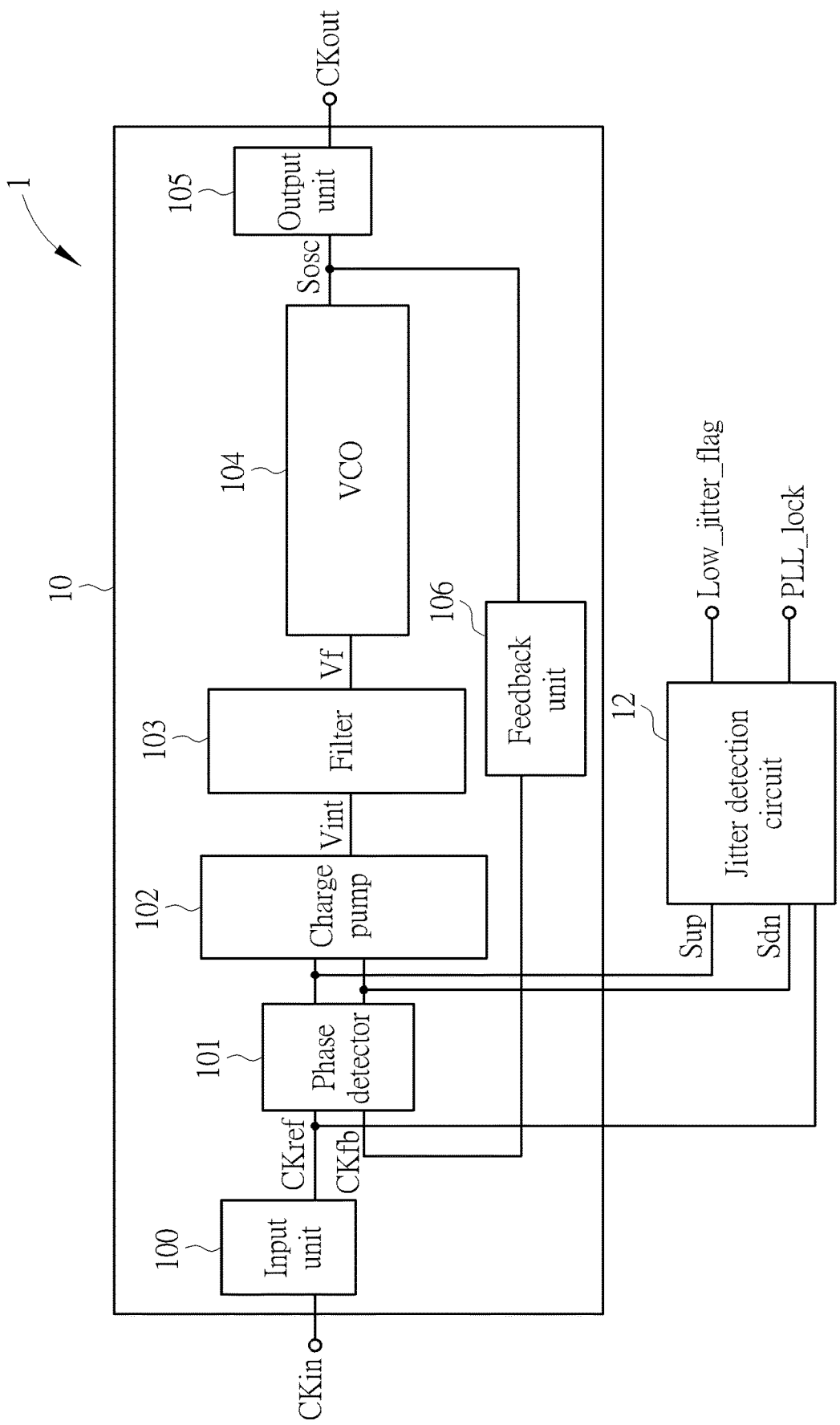
FIG. 1 is a block diagram of an apparatus capable of detecting jitter according to an embodiment of the invention.

FIG. 1 is a block diagram of an apparatus 1 capable of detecting jitter according to an embodiment of the invention. The apparatus 1 may receive an input clock CKin to generate an output clock CKout. The output clock CKout may oscillate at a frequency identical to or different from the input clock CKin. In some embodiments, the frequency of the output clock CKout may be higher than that of the input clock CKin. The input clock CKin may be provided by a crystal oscillator. The apparatus 1 may supply the output clock CKout to other circuits for modulation, demodulation, frequency synthesis or other purposes. Further, the apparatus 1 may detect jitter and a state of the output clock CKout, thereby determining the stability of the output clock CKout and whether the output clock CKout has been locked to a desired frequency. The other circuits may operate in response to the jitter and/or state detection. For example, when the output clock CKout contains jitter and is in an unlocked state, the other circuits may be prevented from using the output clock CKout.

The apparatus 1 may include a phase-locked loop 10 and a jitter detection circuit 12 coupled thereto. The phase-locked loop 10 may lock the phase of the output clock CKout to that of the input clock CKin. The jitter detection circuit 12 may detect the jitter and the state of the output clock CKout.

The phase-locked loop 10 may include an input unit 100, a phase detector 101, a charge pump 102, a filter 103, a voltage-controlled oscillator (VCO) 104, an output unit 105 and a feedback unit 106. The input unit 100 is coupled to the phase detector 101, the phase detector 101 is coupled to the charge pump 102 and the jitter detection circuit 12, the charge pump 102 is coupled to the filter 103, the filter 103 is coupled to the voltage-controlled oscillator 104, the voltage-controlled oscillator 104 is coupled to the output unit 105 and the feedback unit 106, and the feedback unit 106 is coupled to the phase detector 101.

The input unit 100 may be a frequency divider, and may divide the frequency of the input clock CKin by a division ratio to generate a reference clock CKref. The division ratio is a positive number exceeding 1. In some embodiments, the input unit 100 may be a buffer configured to pass the input clock CKin as the reference clock CKref. The phase detector 101 may receive the reference clock CKref and a feedback clock CKfb to generate a lead control signal Sup and a lag control signal Sdn accordingly. In some embodiments, when the reference clock CKref and the feedback clock CKfb are in phase, a pulse in the lead control signal Sup and a corresponding pulse in the lag control signal Sdn may both have a predetermined width, and when the reference clock CKref and the feedback clock CKfb are out-of-phase, one of the pulse in the lead control signal Sup and the corresponding pulse in the lag control signal Sdn may have a shortened width, while the other one of the pulse in the lead control signal Sup and the corresponding pulse in the lag control signal Sdn may still have the predetermined width. In this manner, the phase detector 101 may output information of a phase difference between the reference clock CKref and the feedback clock CKfb to subsequent circuits. The charge pump 102 may generate an intermediate voltage Vint according to the lead control signal Sup and the lag control signal Sdn. The intermediate voltage Vint may represent an error between the phases of the reference clock CKref and the feedback clock CKfb. The filter 103 may be a low pass filter configured to remove high frequency components from the intermediate voltage Vint to generate a DC voltage Vf. The voltage-controlled oscillator 104 may generate an oscillation signal Sosc according to the DC voltage Vf. The output unit 105 may output the clock signal CKout according to the oscillation signal Sosc. The output unit 105 may include a frequency divider or a buffer. A division ratio of the frequency divider in the output unit 105 may be identical or different from the division ratio of the input unit 100.

The feedback unit 106 may generate the feedback clock CKfb according to the oscillation signal Sosc. The feedback unit 106 may include a frequency divider or a buffer. A division ratio of the frequency divider in the feedback unit 106 may be identical or different from the division ratio of the input unit 100 and the division ratio of the output unit 105.

Figure 2:
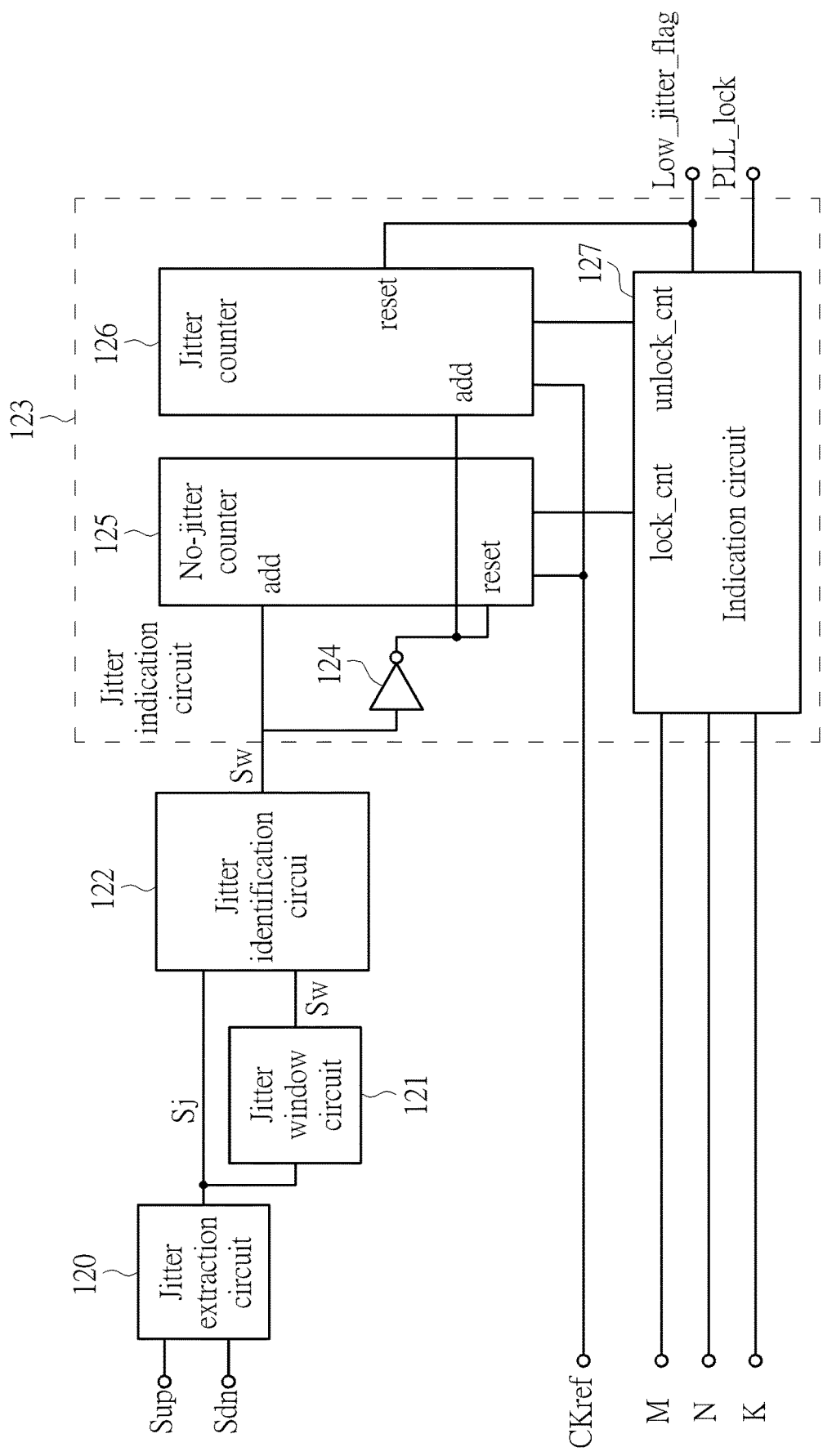
FIG. 2 is a block diagram of the jitter detection circuit in FIG. 1.

FIG. 2 is a block diagram of the jitter detection circuit 12. The jitter detection circuit 12 includes a jitter extraction circuit 120, a jitter window circuit 121, a jitter identification circuit 122 and a jitter indication circuit 123. The jitter extraction circuit 120 may be coupled to the jitter window circuit 121 and the jitter identification circuit 122. The jitter window circuit 121 may be coupled to the jitter identification circuit 122. The jitter identification circuit 122 may be coupled to the jitter indication circuit 123.

The jitter extraction circuit 120 may generate a jitter signal Sj according to the lead control signal Sup and the lag control signal Sdn. In some embodiments, the jitter extraction circuit 120 may include an XOR gate including a first input terminal configured to receive the lead control signal Sup, a second input terminal configured to receive the lag control signal Sdn, and an output terminal configured to output the jitter signal Sj. The XOR gate may perform an XOR operation on the lead control signal Sup and the lag control signal Sdn to generate a pulse in the jitter signal Sj that starts when one of the lead control signal Sup and the lag control signal Sdn is Logical "H" and ends when both the lead control signal Sup and the lag control signal Sdn are Logical "H". The width of the pulse in the jitter signal Sj is determined by the lead control signal Sup and the lag control signal Sdn. When a pulse in the lead control signal Sup and a corresponding pulse in the lag control signal Sdn are substantially equal in width, the pulse in the jitter signal Sj will have a zero-width. When a pulse in the lead control signal Sup and a corresponding pulse in the lag control signal Sdn are different in width, the pulse in the jitter signal Sj will have a non-zero width.

The jitter window circuit 121 may generate a jitter window signal Sw according to the jitter signal Sj. In some embodiments, the jitter window circuit 121 may generate a pulse in the jitter window signal Sw by delaying a starting edge of a pulse in the jitter signal Sj for a predetermined delay time, the pulse in the jitter window signal Sw having a predetermined width. For example, the predetermined delay time may be 560 picoseconds, and the predetermined width may be 400 picoseconds.

The jitter identification circuit 122 may identify jitters in the clock signal CKout according to the jitter signal Sj and the jitter window signal Sw. In some embodiments, the jitter identification circuit 122 may generate a jitter Sid by extracting an overlapping portion of a pulse of the jitter signal Sj and a pulse of the jitter window signal Sw. If the width of the pulse of the jitter signal Sj is wide, the pulse of the jitter signal Sj and the pulse jitter window signal Sw will be partially overlapping, generating a jitter Sid. If the width of the pulse of the jitter signal Sj is narrow, the pulse of the jitter signal Sj and the pulse jitter window signal Sw will be non-overlapping, generating no jitter Sid. Therefore, the presence of an overlapping portion may indicate a large jitter in the clock signal CKout, and the absence of an overlapping portion may indicate a small jitter in the clock signal CKout. The jitter Sid may be represented by, but is not limited to, a negative pulse. The no jitter Sid may be represented by, but is not limited to, Logical "H".

The jitter indication circuit 123 may count the quantity of jitters and output a jitter indication signal Low_jitter_flag and a phase-locked signal PLL_lock according to the number of jitters identified. The jitter indication signal Low_jitter_flag may be, but is not limited to, set to Logical "H" to indicate that the clock signal CKout is stable and in the absence of jitter. The jitter indication signal Low_jitter_flag may be, but is not limited to, set to Logical "L" to indicate that the clock signal CKout is unstable and in the presence of jitter. The phase-locked signal PLL_lock may be, but is not limited to, set to Logical "H" to indicate a locked state, in which that the clock signal CKout is locked to the desired frequency. The phase-locked signal PLL_lock may be, but is not limited to, set to Logical "L" to indicate that an unlocked state, in which that the clock signal CKout is not locked to the desired frequency. The number of jitters identified may be represented by a jitter count unlock_cnt and a no-jitter count lock_cnt, the jitter count unlock_cnt representing the number of times that a jitter is detected, and the no-jitter count lock_cnt representing the number of times that no jitter is detected. The jitter indication circuit 123 may include an inverter 124, a no-jitter counter 125, a jitter counter 126 and an indication circuit 127. The inverter 124 and the no-jitter counter 125 may be coupled to the jitter identification circuit 122, the inverter 124 may be coupled to the no-jitter counter 125 and the jitter counter 126, and the no-jitter counter 125 and the jitter counter 126 may be coupled to the indication circuit 127.

The no-jitter counter 125 may generate the no-jitter count lock_cnt and increment the no-jitter count lock_cnt upon identifying no jitter Sid. Upon power-on, the no-jitter counter 125 may reset the no-jitter count lock_cnt to a default value, e.g., 0. The no-jitter counter 125 may increment the no-jitter count lock_cnt by the reference clock CKref if the jitter signal does not overlap with the jitter window signal. In some embodiments, when there is no jitter Sid, the no-jitter counter 125 may count up by 1 upon each successive clock pulse in the reference clock CKref to update the no-jitter count lock_cnt, and when there is a jitter Sid, the no-jitter counter 125 may reset the no-jitter count lock_cnt to the default value. If the no-jitter count lock_cnt exceeds a predetermined no-jitter threshold M, the indication circuit 127 may output the jitter indication signal Low_jitter_flag indicative of the absence of jitter (Logical "H") and output the phase-locked signal PLL_lock indicative of the clock signal being in the locked state (Logical "H"), and the indication circuit 127 may reset the jitter count unlock_cnt to a default value, e.g., 0. The predetermined no-jitter threshold M may be, but is not limited to, 64.

The inverter 124 may invert the jitter Sid to generate an inverted jitter, e.g., a positive pulse. The jitter counter 126 may generate the jitter count unlock_cnt and increment the jitter count unlock_cnt upon identifying a jitter Sid. Upon power-on or detection of a no-jitter Sid, the jitter counter 126 may reset an intermediate jitter count and the jitter count unlock_cnt to a default value, e.g., 0. The jitter counter 126 may include a ripple counter and output registers. The ripple counter may count up by 1 upon receiving each inverted jitter to update the intermediate jitter count. The output registers may synchronize the intermediate jitter count by the reference clock CKref to generate the jitter count unlock_cnt. In some embodiments, the output registers may be eliminated, and the jitter counter 126 may output the intermediate jitter count as the jitter count unlock_cnt. If the jitter count unlock_cnt is between a first predetermined jitter threshold N and a second predetermined jitter threshold (N+K), the indication circuit 127 may output the jitter indication signal Low_jitter_flag indicative of the presence of jitter (Logical "L"), and output the phase-locked signal PLL_lock indicative of the clock signal CKout being in the locked state (Logical "H"). If the jitter count unlock_cnt exceeds the second predetermined jitter threshold (N+K), the indication circuit 127 may output the jitter indication signal Low_jitter_flag indicative of the presence of jitter (Logical "L"), and output the phase-locked signal PLL_lock indicative of the clock signal CKout being in the unlocked state (Logical "L"). The first predetermined jitter threshold N may be 8, and the second predetermined jitter threshold (N+K) may be 180.

The apparatus 1 detects the jitter and a state of the output clock CKout using the lead control signal Sup and the lag control signal Sdn, ensuring the stability of the output clock CKout and ensuring that the output clock CKout has been locked to the desired frequency.

Figure 3:
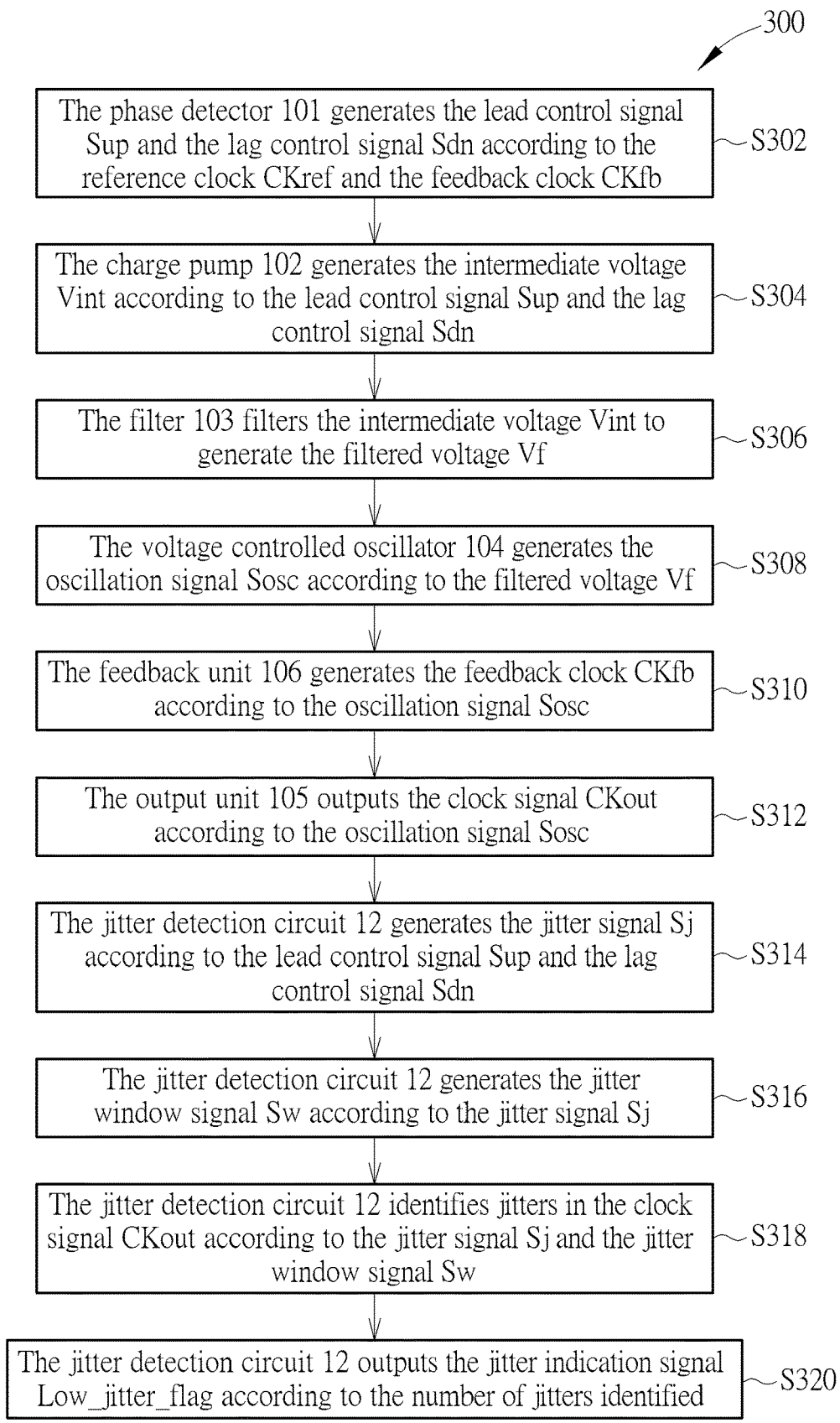
FIG. 3 is a flowchart of a method of detecting jitter in the apparatus in FIG. 1.

FIG. 3 is a flowchart of a method 300 of detecting jitter in the apparatus 1. The method 300 includes Steps S302 to S320 to detect jitter. Steps S302 to S312 are used to generate the clock signal CKout. Steps S304 to S320 are used to detect jitter in the clock signal CKout. Any reasonable step change or adjustment is within the scope of the disclosure. Steps S302 to S320 are detailed as follows:

Step S302: The phase detector 101 generates the lead control signal Sup and the lag control signal Sdn according to the reference clock CKref and the feedback clock CKfb;

Step S304: The charge pump 102 generates the intermediate voltage Vint according to the lead control signal Sup and the lag control signal Sdn;

Step S306: The filter 103 filters the intermediate voltage Vint to generate the filtered voltage Vf;

Step S308: The voltage controlled oscillator 104 generates the oscillation signal Sosc according to the filtered voltage Vf;

Step S310: The feedback unit 106 generates the feedback clock CKfb according to the oscillation signal Sosc;

Step S312: The output unit 105 outputs the clock signal CKout according to the oscillation signal Sosc;

Step S314: The jitter detection circuit 12 generates the jitter signal Sj according to the lead control signal Sup and the lag control signal Sdn;

Step S316: The jitter detection circuit 12 generates the jitter window signal Sw according to the jitter signal Sj;

Step S318: The jitter detection circuit 12 identifies jitters in the clock signal CKout according to the jitter signal Sj and the jitter window signal Sw;

Step S320: The jitter detection circuit 12 outputs the jitter indication signal Low_jitter_flag according to the number of jitters identified.

Upon power-on or a reset, the jitter count unlock_cnt may be set to the default value (0), the no-jitter count lock_cnt may be set to the default value (0), the Low_jitter_flag may be set to indicate the presence of jitter (Logical "L"), and the phase-locked signal PLL_lock may be set to indicate the unlocked state (Logical "L"), and the apparatus 1 may carry out the method 300. In some embodiments, the method 300 may further include Steps of outputting the phase-locked signal PLL_lock according to the number of jitters identified. Other details of the method 300 have been provided in the preceding paragraphs and will be omitted here for brevity.

Figure 4:
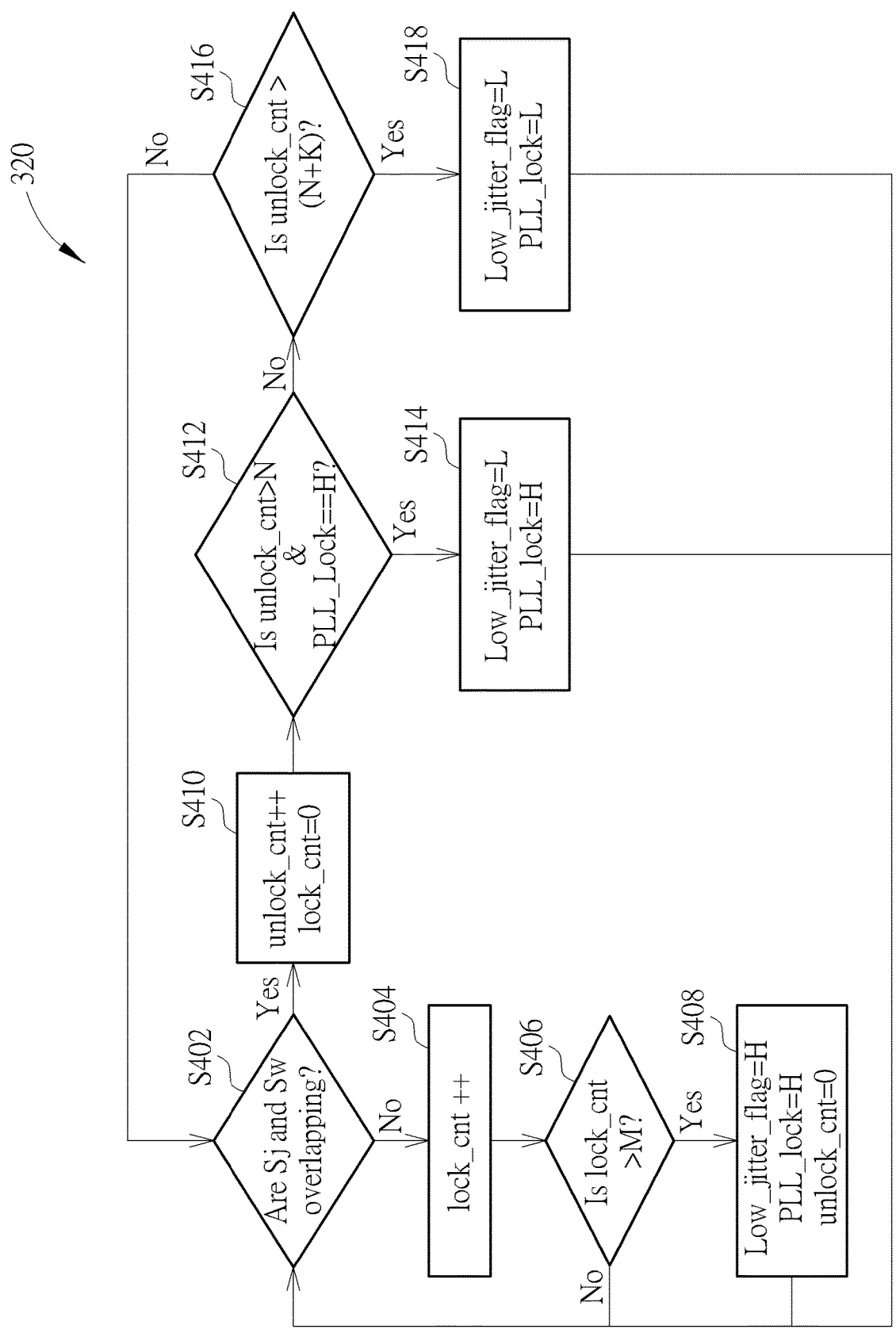
FIG. 4 is a flowchart of Step S320 of the method in FIG. 3.

FIG. 4 is a flowchart of Step S320 of the method in FIG. 3. Step S320 includes Steps S402 to S418 to detect jitter in the clock signal CKout. Steps S402 to S408 are used to determine that the clock signal CKout is in the absence of jitter and in the locked state. Steps S402, S410 to S414 are used to determine that the clock signal CKout is in the presence of jitter and in the locked state. Steps S402, S410, S412, S416 and S418 are used to determine that the clock signal CKout is in the presence of jitter and in the unlocked state. Any reasonable step change or adjustment is within the scope of the disclosure. Steps S402 to S418 are detailed as follows:

Step S402: The jitter identification circuit 122 determines whether the jitter signal Sj and the jitter window signal Sw are overlapping? If so, go to Step S410, and if not, go to Step S404;

Step S404: The no-jitter counter 125 increments the no-jitter count lock_cnt;

Step S406: The indication circuit 127 determines whether the no-jitter count lock_cnt exceeds M? If so, go to Step S408, and if not, go to Step S402;

Step S408: The indication circuit 127 sets the jitter indication signal Low_jitter_flag to Logical "H" and sets the phase-locked signal PLL_lock to Logical "H", and resets the jitter counter 126; go to Step S402;

Step S410: Reset the no-jitter counter 125, and the jitter counter 126 increments the jitter count unlock_cnt;

Step S412: The indication circuit 127 determines whether the jitter count unlock_cnt exceeds N and phase-locked signal PLL_lock is Logical "H"? If so, go to Step S414, and if not, go to Step S416;

Step S414: The indication circuit 127 sets the jitter indication signal Low_jitter_flag to Logical "L" and sets the phase-locked signal PLL_lock to Logical "H"; go to Step S402;

Step S416: The indication circuit 127 determines whether the jitter count unlock_cnt exceeds (N+K)? If so, go to Step S418, and if not, go to Step S402;

Step S418: The indication circuit 127 sets the jitter indication signal Low_jitter_flag to Logical "L" and sets the phase-locked signal PLL_lock to Logical "L"; go to Step S402.

Details of the Step S320 have been provided in the preceding paragraphs and will be omitted here for brevity.

Figure 5:
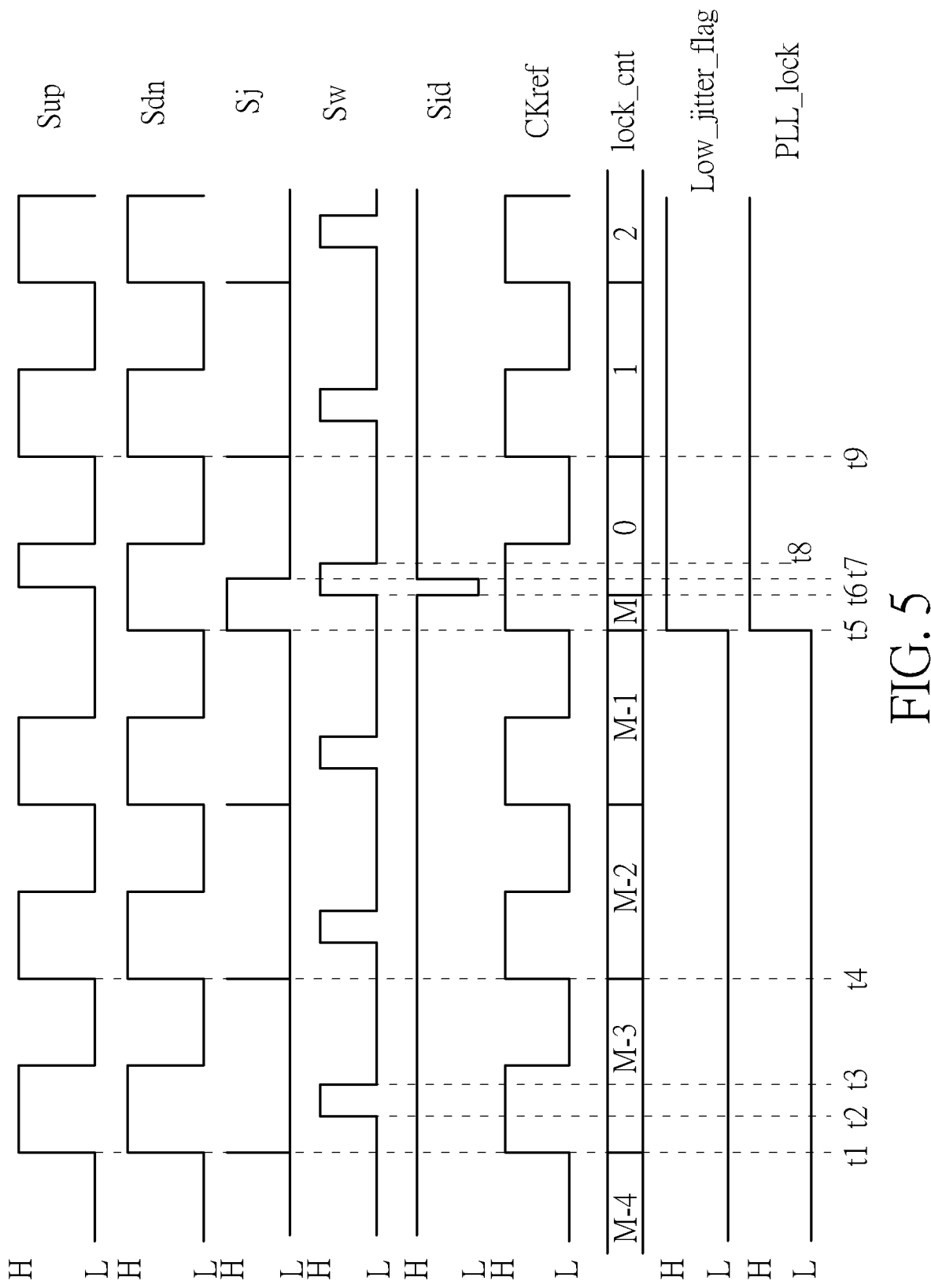
FIG. 5 is a timing diagram of the jitter detection circuit in FIG. 1 according to an embodiment of the invention.

FIG. 5 is a timing diagram of the jitter detection circuit 12 according to an embodiment of the invention.

At Time t1, the lead control signal Sup and the lag control signal Sdn are both at a rising edge and in phase, resulting in a spike pulse in the jitter signal Sj, the jitter Sid remains at Logical "H", the no-jitter count lock_cnt is incremented to (M−3) by a rising edge of the reference clock CKref, the jitter indication signal Low_jitter_flag and the phase-locked signal PLL_lock are at Logical "L".

At Time t2, a pulse of the jitter window signal Sw starts, the predetermined delay time (t2−t1) between the starting edge of the spike pulse of the jitter signal Sj and the starting edge of the pulse of the jitter window signal Sw may be 560 picoseconds, and the jitter Sid remains at Logical "H" to indicate the absence of jitter.

At Time t3, the pulse of the jitter window signal Sw ends, and the predetermined width (t3−t2) of the pulse of the jitter window signal Sw may be 400 picoseconds.

At Time t4, the lead control signal Sup and the lag control signal Sdn are both at a rising edge and in phase, resulting in another spike pulse in the jitter signal Sj, the jitter Sid remains at Logical "H", the no-jitter count lock_cnt is incremented to (M−2) by a rising edge of the reference clock CKref, the jitter indication signal Low_jitter_flag and the phase-locked signal PLL_lock remain at Logical "L". In this manner, the no-jitter count lock_cnt continues to increment on each rising edge of the reference clock CKref since the lead control signal Sup and the lag control signal Sdn are in phase.

At Time t5, the lead control signal Sup is at Logical "L" and the lag control signal Sdn is at a rising edge and the lead control signal Sup and the lag control signal Sdn are out-of-phase, starting a pulse in the jitter signal Sj, the jitter Sid remains at Logical "H", the no-jitter count lock_cnt is incremented to the predetermined no-jitter threshold M, the jitter indication signal Low_jitter_flag and the phase-locked signal PLL_lock are switched from Logical "L" to Logical "H", indicating no jitter and a locked phase, respectively.

At Time t6, a pulse of the jitter window signal Sw starts, the pulse in the jitter signal Sj and the pulse in the jitter window signal Sw start to overlap, the jitter Sid is switched to Logical "L" to indicate the presence of jitter, the no-jitter count lock_cnt is reset to 0, and the jitter indication signal Low_jitter_flag and the phase-locked signal PLL_lock remain at Logical "H". The predetermined delay time (t6−t5) between the starting edge of the pulse of the jitter signal Sj and the starting edge of the pulse of the jitter window signal Sw may be 560 picoseconds At Time t7, the lead control signal Sup is at a rising edge and the lag control signal Sdn is at Logical "H", the pulse in the jitter signal Sj ends, the jitter Sid is switched to Logical "H", the no-jitter count lock_cnt remains at 0, and the jitter indication signal Low_jitter_flag and the phase-locked signal PLL_lock remain at Logical "H".

At Time t8, the lead control signal Sup and the lag control signal Sdn remain at Logical "H", the jitter signal Sj remains at Logical "L", the pulse of the jitter window signal Sw ends, the jitter Sid remains at Logical "H", and the jitter indication signal Low_jitter_flag and the phase-locked signal PLL_lock remain at Logical "H". The predetermined width (t8−t7) of the pulse of the jitter window signal Sw may be 400 picoseconds.

At Time t9, the lead control signal Sup and the lag control signal Sdn are at a rising edge and in phase, the jitter Sid remains at Logical "H", the no-jitter count lock_cnt is incremented to 1, and the jitter indication signal Low_jitter_flag and the phase-locked signal PLL_lock remain at Logical "H".

Figure 6:
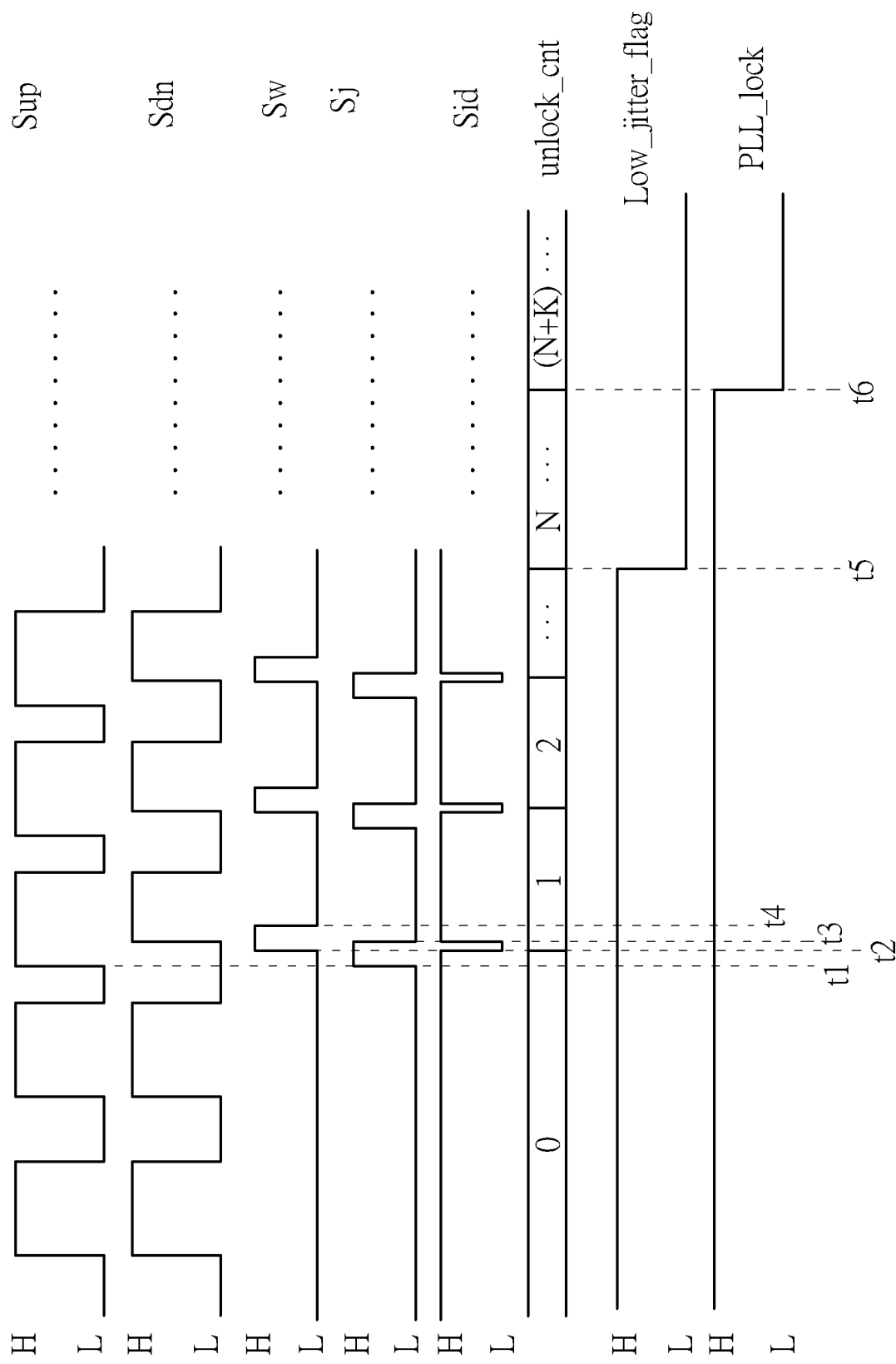
FIG. 6 is a timing diagram of the jitter detection circuit in FIG. 1 according to another embodiment of the invention.

FIG. 6 is a timing diagram of the jitter detection circuit 12 according to another embodiment of the invention.

Prior to Time t1, the jitter indication signal Low_jitter_flag and the phase-locked signal PLL_lock are both at Logical "H", indicating no jitter and a locked state.

At Time t1, the lead control signal Sup is at a rising edge and the lag control signal Sdn is at Logical "L". The lead control signal Sup and the lag control signal Sdn are out-of-phase, starting a pulse in the jitter signal Sj. The jitter Sid remains at Logical "H", the jitter count unlock_cnt is 0, the jitter indication signal Low_jitter_flag and the phase-locked signal PLL_lock remain at Logical "H".

At Time t2, a pulse of the jitter window signal Sw starts, the pulse in the jitter signal Sj and the pulse in the jitter window signal Sw start to overlap, the jitter Sid is switched to Logical "L" to start a pulse, the jitter count unlock_cnt is incremented to 1 by the starting edge of the pulse of the jitter Sid, and the jitter indication signal Low_jitter_flag and the phase-locked signal PLL_lock remain at Logical "H".

At Time t3, the lead control signal Sup is at Logical "H" and the lag control signal Sdn is at a rising edge, the pulse in the jitter signal Sj ends, the jitter Sid is switched to Logical "H", the no-jitter count lock_cnt remains 1, and the jitter indication signal Low_jitter_flag and the phase-locked signal PLL_lock remain at Logical "H".

At Time t4, the lead control signal Sup and the lag control signal Sdn remain at Logical "H", the jitter signal Sj remains at Logical "L", the pulse of the jitter window signal Sw ends, the jitter Sid remains at Logical "H", and the jitter indication signal Low_jitter_flag and the phase-locked signal PLL_lock remain at Logical "H".

After Time t4, the lead control signal Sup and the lag control signal Sdn remain out-of-phase, the overlapping portions of the pulses in the jitter signal Sj and the jitter window signal Sw result in the negative pulses in the jitter Sid, continuing to increment the jitter count unlock_cnt until Time t5. At Time t5, the jitter count unlock_cnt until Time t5 reaches the first predetermined jitter threshold N, and the jitter indication signal Low_jitter_flag is switched to Logical "L" while the phase-locked signal PLL_lock remains at Logical "H", indicating jitter and the locked state.

After Time t5, the lead control signal Sup and the lag control signal Sdn remain out-of-phase, the overlapping portions of the pulses in the jitter signal Sj and the jitter window signal Sw result in the negative pulses in the jitter Sid, continuing to increment the jitter count unlock_cnt until Time t6. At Time t6, the jitter count unlock_cnt reaches the second predetermined jitter threshold (N+K), and the phase-locked signal PLL_lock is switched to Logical "L" while the jitter indication signal Low_jitter_flag remains at Logical "L", indicating jitter and an unlocked state.

Figure 7:
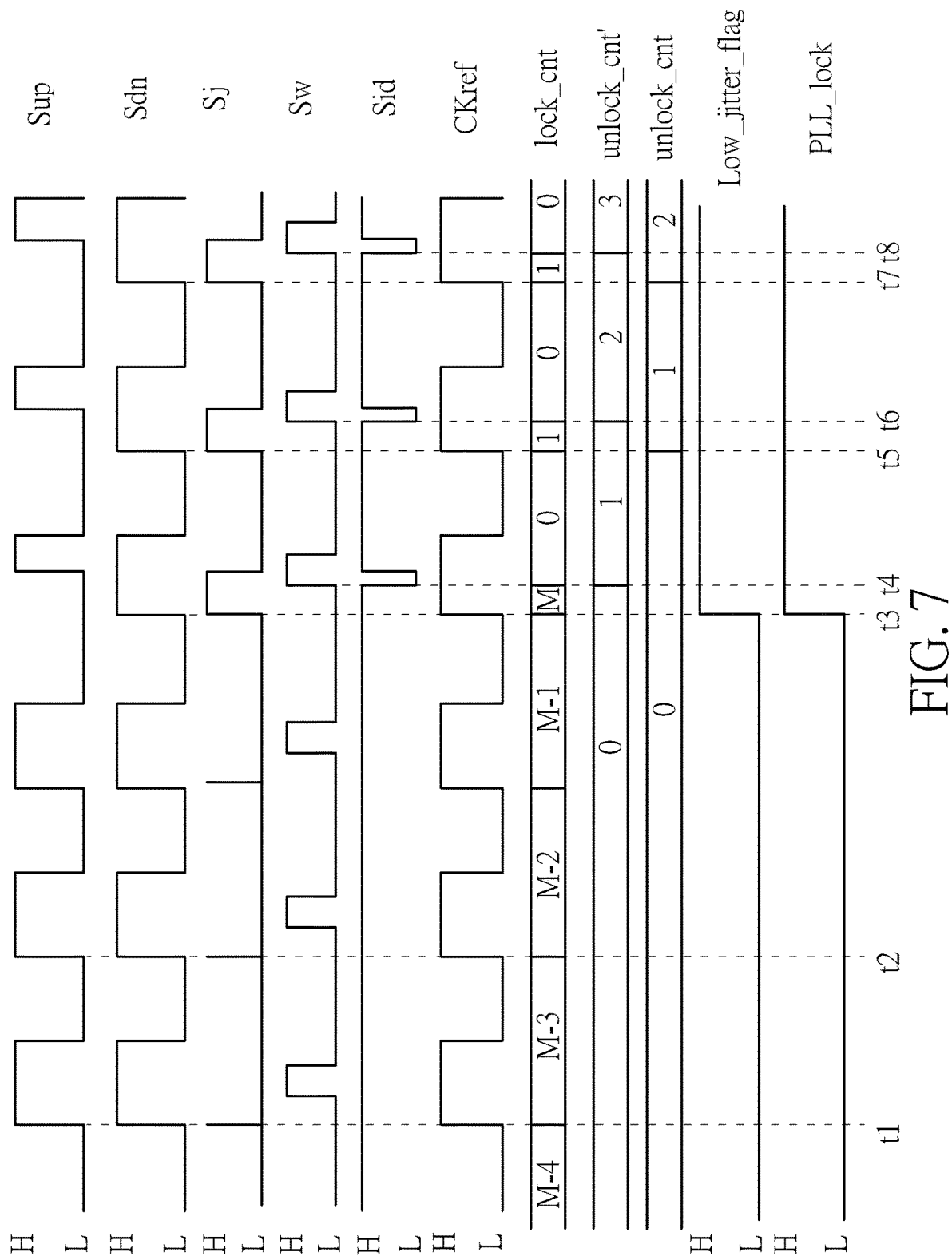
FIG. 7 is a timing diagram of the jitter detection circuit in FIG. 1 according to another embodiment of the invention.

FIG. 7 is a timing diagram of the jitter detection circuit 12 according to another embodiment of the invention.

At Time t1, the lead control signal Sup and the lag control signal Sdn are both at Logical "H" and in phase, resulting in a spike pulse in the jitter signal Sj, the jitter Sid remains at Logical "H", the no-jitter count lock_cnt is incremented to (M−3) by a rising edge of the reference clock CKref, the intermediate jitter count unlock_cnt' and the jitter count unlock_cnt are both 0, and the jitter indication signal Low_jitter_flag and the phase-locked signal PLL_lock are at Logical "L".

At Time t2, the lead control signal Sup and the lag control signal Sdn are both at Logical "H" and in phase, resulting in another spike pulse in the jitter signal Sj, the jitter Sid remains at Logical "H", the no-jitter count lock_cnt is incremented to (M−2), the intermediate jitter count unlock_cnt' and the jitter count unlock_cnt are both 0, and the jitter indication signal Low_jitter_flag and the phase-locked signal PLL_lock are at Logical "L". From Times t2 to t3, the lead control signal Sup and the lag control signal Sdn continue to be in phase, the no-jitter count lock_cnt continue to be incremented, the intermediate jitter count unlock_cnt' and the jitter count unlock_cnt are both 0, and the jitter indication signal Low_jitter_flag and the phase-locked signal PLL_lock are at Logical "L".

At Time t3, the lead control signal Sup and the lag control signal Sdn are out-of-phase, generating a pulse in the jitter signal Sj, the no-jitter count lock_cnt reaches the predetermined no-jitter threshold M, the intermediate jitter count unlock_cnt' and the jitter count unlock_cnt are both 0, and the jitter indication signal Low_jitter_flag and the phase-locked signal PLL_lock are switched to Logical "H".

At Time t4, a pulse of the jitter window signal Sw starts, the no-jitter count lock_cnt is reset to 0, and the intermediate jitter count unlock_cnt' is incremented to 1 by the starting edge of the pulse of the jitter Sid, the jitter count unlock_cnt is 0, and the jitter indication signal Low_jitter_flag and the phase-locked signal PLL_lock remain at Logical "H".

At Time t5, the lead control signal Sup and the lag control signal Sdn are out-of-phase, generating another pulse in the jitter signal Sj, the no-jitter count lock_cnt is incremented to 1, the intermediate jitter count unlock_cnt' remains at 1, and the jitter count unlock_cnt is updated to be 1 by a starting edge of the reference clock CKref, and the jitter indication signal Low_jitter_flag and the phase-locked signal PLL_lock remain at Logical "H".

At Time t6, another pulse of the jitter window signal Sw starts, the no-jitter count lock_cnt is reset to 0, and the intermediate jitter count unlock_cnt' is incremented to 2 by the starting edge of the pulse of the jitter Sid, the jitter count unlock_cnt remains at 1, and the jitter indication signal Low_jitter_flag and the phase-locked signal PLL_lock remain at Logical "H".

At Time t7, the lead control signal Sup and the lag control signal Sdn are out-of-phase, generating another pulse in the jitter signal Sj, the no-jitter count lock_cnt is incremented to 1, the intermediate jitter count unlock_cnt' remains at 2, and the jitter count unlock_cnt is updated to be 2 by a starting edge of the reference clock CKref, and the jitter indication signal Low_jitter_flag and the phase-locked signal PLL_lock remain at Logical "H".

At Time t8, another pulse of the jitter window signal Sw starts, the no-jitter count lock_cnt is reset to 0, and the intermediate jitter count unlock_cnt' is incremented to 3 by the starting edge of the pulse of the jitter Sid, the jitter count unlock_cnt remains at 2, and the jitter indication signal Low_jitter_flag and the phase-locked signal PLL_lock remain at Logical "H".

The embodiments in FIG. 1 to 7 are used to detect the jitter and a state of the output clock CKout using the lead control signal Sup and the lag control signal Sdn, ensuring the stability of the output clock CKout and ensuring that the output clock CKout has been locked to the desired frequency.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of detecting jitter, the method comprising:
a phase detector generating a lead control signal and a lag control signal according to a reference clock and a feedback clock;
a charge pump generating an intermediate voltage according to the lead control signal and the lag control signal;
a filter filtering the intermediate voltage to generate a filtered voltage;
a voltage controlled oscillator generating an oscillation signal according to the filtered voltage;
a feedback unit generating the feedback clock according to the oscillation signal;
an output unit outputting a clock signal according to the oscillation signal;
a jitter detection circuit generating a jitter signal according to the lead control signal and the lag control signal;
the jitter detection circuit generating a jitter window signal according to the jitter signal;
the jitter detection circuit generating a jitter by extracting an overlapping portion of a pulse of the jitter signal and a pulse of the jitter window signal; and
the jitter detection circuit outputting a jitter indication signal according to a quantity of jitters identified.

2. The method of claim 1, further comprising the jitter detection circuit incrementing a no-jitter count upon identifying no jitter;
wherein the jitter detection circuit outputting the jitter indication signal according to the quantity of the jitters identified comprises:
if the no-jitter count exceeds a predetermined no-jitter threshold, the jitter detection circuit outputting the jitter indication signal indicative of an absence of jitter.

3. The method of claim 2, further comprising:
the jitter detection circuit outputting a phase-locked signal indicative of the clock signal being in a locked state.

4. The method of claim 2, wherein the jitter detection circuit incrementing a no-jitter count upon identifying no jitter comprises:
the jitter detection circuit incrementing a no-jitter count by the reference clock if the jitter signal does not overlap with the jitter window signal.

5. The method of claim 1, further comprising the jitter detection circuit incrementing a jitter count upon identifying a jitter;
   wherein the jitter detection circuit outputting the jitter indication signal according to the quantity of the jitters identified comprises:
      if the jitter count is between a first predetermined jitter threshold and a second predetermined jitter threshold, and a phase-locked signal is indicative of the clock signal being in a locked state, the jitter detection circuit outputting the jitter indication signal indicative of a presence of jitter.

6. The method of claim 1, further comprising the jitter detection circuit incrementing a jitter count upon identifying a jitter;
   wherein the jitter detection circuit outputting the jitter indication signal according to the quantity of the jitters identified comprises:
      if the jitter count exceeds a second predetermined jitter threshold, the jitter detection circuit outputting the jitter indication signal indicative of a presence of jitter and a phase-locked signal indicative of the clock signal being in an unlocked state.

7. The method of claim 1, wherein the jitter detection circuit generating the jitter window signal according to the jitter signal comprises the jitter detection circuit generating a pulse of the jitter window signal by delaying a starting edge of the jitter signal, the pulse having a predetermined width.

8. The method of claim 1, further comprising counting the quantity of jitters.

9. The method of claim 1, wherein the feedback unit is a feedback divider, and the feedback unit generating the feedback clock according to the oscillation signal is the feedback divider dividing the oscillation signal to generate the feedback clock.

10. The method of claim 1, wherein the output unit is an output divider, and the output unit outputting the clock signal according to the oscillation signal is the output divider dividing the oscillation signal to generate the clock signal.

11. An apparatus of detecting jitter, the apparatus comprising:
   a phase-locked loop comprising
      a phase detector configured to generating a lead control signal and a lag control signal according to a reference clock and a feedback clock;
      a charge pump coupled to the phase detector, and configured to generate an intermediate voltage according to the lead control signal and the lag control signal;
      a filter coupled to the charge pump, and configured to filter the intermediate voltage to generate a filtered voltage;
      a voltage-controlled oscillator coupled to the filter, and configured to generate an oscillation signal according to the filtered voltage; and
      a feedback unit coupled to the voltage-controlled oscillator and the phase detector, and configured to generate the feedback clock according to the oscillation signal; and
   an output unit coupled to the voltage-controlled oscillator, and configured to output a clock signal according to the oscillation signal; and
   a jitter detection circuit coupled to the phase detector, and comprising:
      a jitter extraction circuit configured to generate a jitter signal according to the lead control signal and the lag control signal;
      a jitter window circuit coupled to the jitter extraction circuit, and configured to generate a jitter window signal according to the jitter signal;
      a jitter identification circuit coupled to the jitter extraction circuit and the jitter window circuit, and configured to generate a jitter by extracting an overlapping portion of a pulse of the jitter signal and a pulse of the jitter window signal; and
      a jitter indication circuit coupled to the jitter identification circuit and configured to output a jitter indication signal according to a quantity of jitters.

12. The apparatus of claim 11, wherein the jitter indication circuit comprises:
   a no-jitter counter coupled to the jitter identification circuit and configured to increment a no-jitter count upon identifying no jitter; and
   an indication circuit coupled to the no-jitter counter, and if the no-jitter count exceeds a predetermined no-jitter threshold, configured to output the jitter indication signal indicative of an absence of jitter and output a phase-locked signal indicative of the clock signal being in a locked state.

13. The apparatus of claim 12, wherein the no-jitter counter is configured to increment a no-jitter count by the reference clock if the jitter signal does not overlap with the jitter window signal.

14. The apparatus of claim 11, wherein jitter indication circuit comprises:
   a jitter counter coupled to the jitter identification circuit and configured to increment a jitter count upon identifying a jitter; and
   an indication circuit coupled to the jitter counter, and if the jitter count is between a first predetermined jitter threshold and a second predetermined jitter threshold, and a phase-locked signal is indicative of the clock signal being in a locked state, configured to output the jitter indication signal indicative of a presence of jitter.

15. The apparatus of claim 11, wherein jitter indication circuit comprises:
   a jitter counter coupled to the jitter identification circuit and configured to increment a jitter count upon identifying a jitter; and
   an indication circuit coupled to the jitter counter, and if the jitter count exceeds a second predetermined jitter threshold, configured to output the jitter indication signal indicative of a presence of jitter and a phase-locked signal indicative of the clock signal being in an unlocked state.

16. The apparatus of claim 11, wherein the jitter detection circuit is configured to generate a pulse of the jitter window signal by delaying a starting edge of the jitter signal, the pulse having a predetermined width.

17. The apparatus of claim 11, wherein the jitter indication circuit is further configured to count the quantity of jitters.

18. The apparatus of claim 11, wherein the feedback unit is a feedback divider configured to divide the oscillation signal to generate the feedback clock; and
   the output unit is an output divider configured to divide the oscillation signal to generate the clock signal.

* * * * *